(12) United States Patent
Konishi et al.

(10) Patent No.: US 6,683,006 B2
(45) Date of Patent: Jan. 27, 2004

(54) FILM FORMING METHOD AND FILM FORMING APPARATUS

(75) Inventors: Nobuo Konishi, Nirasaki (JP); Mitsuaki Iwashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/176,051

(22) Filed: Jun. 21, 2002

(65) Prior Publication Data
US 2002/0197878 A1 Dec. 26, 2002

(30) Foreign Application Priority Data
Jun. 25, 2001 (JP) ........................... 2001-191954

(51) Int. Cl.[7] ............... H01L 21/302; H01L 21/461; H01L 21/31; H01L 21/469
(52) U.S. Cl. ................. 438/723; 438/707; 438/781
(58) Field of Search ................. 438/723, 707, 438/780, 781; 156/345.1; 430/313

(56) References Cited

U.S. PATENT DOCUMENTS

| | | | |
|---|---|---|---|
| 5,924,005 A | * 7/1999 | Waldo | ........................ 438/623 |
| 6,248,168 B1 | 6/2001 | Takeshita et al. | |
| 6,348,407 B1 | * 2/2002 | Gupta et al. | ................. 438/637 |
| 6,465,157 B1 | * 10/2002 | Li et al. | ..................... 430/313 |
| 6,475,904 B2 | * 11/2002 | Okoroanyanwu et al. | ... 438/637 |
| 6,514,873 B1 | * 2/2003 | Nakagawa et al. | ......... 438/725 |
| 2002/0187638 A1 | * 12/2002 | Nakawaga et al. | ......... 438/689 |
| 2003/0049561 A1 | * 3/2003 | Angelopoulos et al. | .. 430/270.1 |

* cited by examiner

Primary Examiner—Alexander Ghyka
(74) Attorney, Agent, or Firm—Rader, Fishman & Grauer PLLC

(57) ABSTRACT

After coating a resist for silylation on the semi-conductor substrate, the resist is exposed with a pattern. Then the silylation process is performed to form a silylated layer and the silylated layer is hardened with performing an electron beam processing or a ultra-violet ray processing. After that, an etching is performed with using the hardened silylated layer as a mask and the wiring step is taken without removing the hardened silylated layer as a stopper for chemical mechanical polishing. With this embodiment, the patterning steps of an insulation film can be simplified.

5 Claims, 12 Drawing Sheets

PRIOR ART

FILM FORMING METHOD AND FILM FORMING APPARATUS

BACKGROUND OF THE INVENTION

1. Field of the Invention

The present invention relates to a film forming method to simplify steps in forming a pattern on a semiconductor device. More specifically, the present invention relates to a film forming method using a silylation process and a film forming apparatus.

2. Description of the Related Art

In a manufacturing step in a process of a semiconductor device an inter-layer insulation film is formed on a wafer. In particular, for example, a material of fluoropolymer type and a siloxane type are used as an insulation film material in order to realize low dielectric constant.

For example, the inter-layer insulation film is formed with SOD (Spin on Dielectics, coating method) system. In the SOD (Spin on Dielectric) system, a film is spin-coated on a wafer and an insulation film is formed with performing processes like chemical process or heating process on the wafer. A hard mask made of silicon dioxide ($SiO_2$) is formed on the coating film and resist is coated thereon, followed by pattern drawing on the coated resist and the pattern drawing is performed further on the insulation film using the patterned resist as a mask.

Then, after forming a barrier metal layer, copper (Cu) conductor is embedded and a surface thereof is planarized with performing a Chemical Mechanical Polishing (CMP) using the barrier metal layer as a stopper.

Incidentally, in recent years, a semi-conductor device has become more precise and higher resolution is required when drawing a pattern on a wafer. For this reason, there is an increasing demand for higher quality in the lithography technology used in the wafer processing and a resist material.

A multi-layer resist process is used as a technology to cope with such situation. The multi-layer resist process is drawing patterns on an inter-layer insulation film and a hard-mask with coating a plurality of layers of the resist, and drawing patterns on the layers of the resist one by one from the top. Although the aforementioned method has an advantage that a minute pattern can be formed precisely for it is possible to reduce the thickness of a resist layer in an upper layer, there is a problem that a special resist material is required.

To solve such problem, a silylation processing is used. This method selectively introduces silicon atoms solely onto a desired part of the resist with silylation process after exposure so that oxygen plasma etching resistance is provided. After the process the micro-pattern is formed. Additionally, this method allows commercially available resists, having outstanding performances in both sensitivity and resolution, to be used as they are. The method can also be generally applied to various forms of exposure such as using electron beam and X-rays as well as light exposure.

A film forming method using a common silylation processing will be explained below with reference to drawings.

FIG. 11 is a schematic view showing a conventional silylation processing, and FIG. 12 is a flow chart explaining processing steps as illustrated in FIG. 11.

After an inter-layer insulation film 301 is spin-coated on the wafer W with a coating apparatus as illustrated in FIG. 11A (Step 1), oxidation silicon is coated as a hard mask 302 on the insulation film as illustrated in FIG. 11B. Next, a resist 303 is coated on the hard mask as illustrated in FIG. 11C (Step 2), then an upper layer resist 304 as a silylated resist is coated thereon thinly compared with the resist 303 as illustrated in FIG. 11D (step 3). After that, the wafer undergoes a pre-baking process (step 4), and the upper layer resist 304 is exposed with an aligner as illustrated in FIG. 11E (Step 5). Then the wafer undergoes a post-baking process (Step 6), followed by a silylation process of exposing to an organic gas containing, for example, an organic silane such as a halogenation alkyl silane having Si atoms and the like, for a predetermined time period as illustrated in FIG. 11F (Step 7) and un-exposed portion becomes a silylated layer by silylation reaction. Thereafter, the resist is hardened in an UV apparatus (Step 8). Then, the upper layer resist 304 is etched except for the silylated layer and a micro-pattern is formed as illustrated in FIG. 11G (Step 9). After the upper layer resist 304 and the lower layer resist 303 are removed simultaneously as illustrated in FIG. 11H (Step 10), a barrier metal is coated thereon and a barrier metal layer is formed as illustrated in FIG. 11I (Step 11). Then Cu is embedded with plating the substrate with Cu as illustrated in FIG. 11J (Step 12), and the surface is planarized with Chemical Mechanical Polishing (CMP) as illustrated in FIG. 11K (Step 13).

However, in this process, the resist film for silylation has to be coated on the layer of the resist and has to be removed again, causing increase in the number of steps, leading to a complication. In addition, a hard-mask is required to be coated on the inter-layer insulation film that also is a cause of the steps becoming complicated.

SUMMARY OF THE INVENTION

The present invention is made from the above-described point of view and the object thereof is to provide a film forming method enabling a resist to be used as a hard mask with performing a silylation process thereon. Further, an object of the present invention is to provide a film forming method that improves throughput with enabling the resist film for silylation to be used as a CMP stopper instead of removing thereof, with using an assisting technology such as an electron beam and the like and hardening not only the surface of the resist but also the inside thereof and simplifying the manufacturing steps.

To attain the aforesaid objects, the present invention has the steps of (a) coating a resist film for silylation on a surface of an insulation film of a semiconductor substrate, (b) exposing a pattern on the resist film for silylation, (c) performing a silylation process with causing the resist film for silylation chemically react with a compound including silicon and forming a silylated layer, (d) etching the insulation film using the silylated layer as a mask, and (e) forming a metal film on the silylated layer without removing the silylated layer used as the mask.

According to the aforesaid structure, since the resist for silylation is applied directly onto the insulation film and being used as a hard mask, patterning the insulation film with a single layer of the resist film for silylation becomes possible. Moreover, the silylated resist can also be used as a CMP stopper without being removed. The manufacturing steps can be simplified with this method.

Also, in the present invention, the mask is formed with dry etching the silylated layer in the step (d). The step is again simplified since it is not required to form a hardmask beforehand.

Additionally, in the present invention, a step of hardening the silylated layer with performing an electron beam processing or an ultraviolet ray processing may be provided before the step (d), or a step of hardening the silylated layer with performing electron beam processing or ultraviolet ray processing may be provided after the step (d). The silylated layer is able to be used as a CMP stopper thereafter since the inside as well as the surface of the silylated layer can be hardened.

Further, the present invention has a step of planarizing the film surface with performing a chemical mechanical polishing using the silylated layer as a stopper after the step (e). The step is further simplified since the silylated layer can be used as a CMP stopper without removing thereof.

The present invention has a film forming apparatus disposed adjacent to an aligner selectively exposing a resist film for silylation, an etching apparatus etching an insulation film using a silylated layer as a mask and a metal film forming apparatus forming a metal film on the silylated layer being used as the mask without removing thereof, comprising a resist film for silylation forming portion forming a resist film for silylation on a surface of an insulation film formed on a surface of a substrate, a silylated layer forming portion performing a silylation process for forming a silylated layer with causing the resist film for silylation chemically react with a compound including silicon, and a transfer mechanism transferring the substrate among the resist film for silylation forming portion, silylated layer forming portion, the aligner, the etching apparatus and the metal film forming apparatus.

In the present invention, for example, patterning the insulation film can be performed with a single-layer of the resist film for silylation since the resist film for silylation is used as a hard mask with having the resist for silylation applied directly onto the insulation film and silylating the resist film for silylation in the silylated layer forming portion. Furthermore, the silylated resist is, for example, can be used for a CMP stopper without removing thereof. Therefore, a process of removing resist can be omitted and throughput can be improved.

Additionally, in the present invention, the step is simplified and throughput can be improved since it is not required to form the hard mask beforehand for the etching portion forms the mask with dry etching the silylated layer.

These objects and still other objects and advantages of the present invention will become apparent upon reading the following specification when taken in conjunction with the accompanying drawings.

DETAILED DESCRIPTION OF THE PREFERRED EMBODIMENT

Preferred embodiments of the present invention will be explained below with reference to the drawings.

(A First Embodiment)

First, a structure of an apparatus in which steps according to the present invention is performed will be explained.

Figure 1:
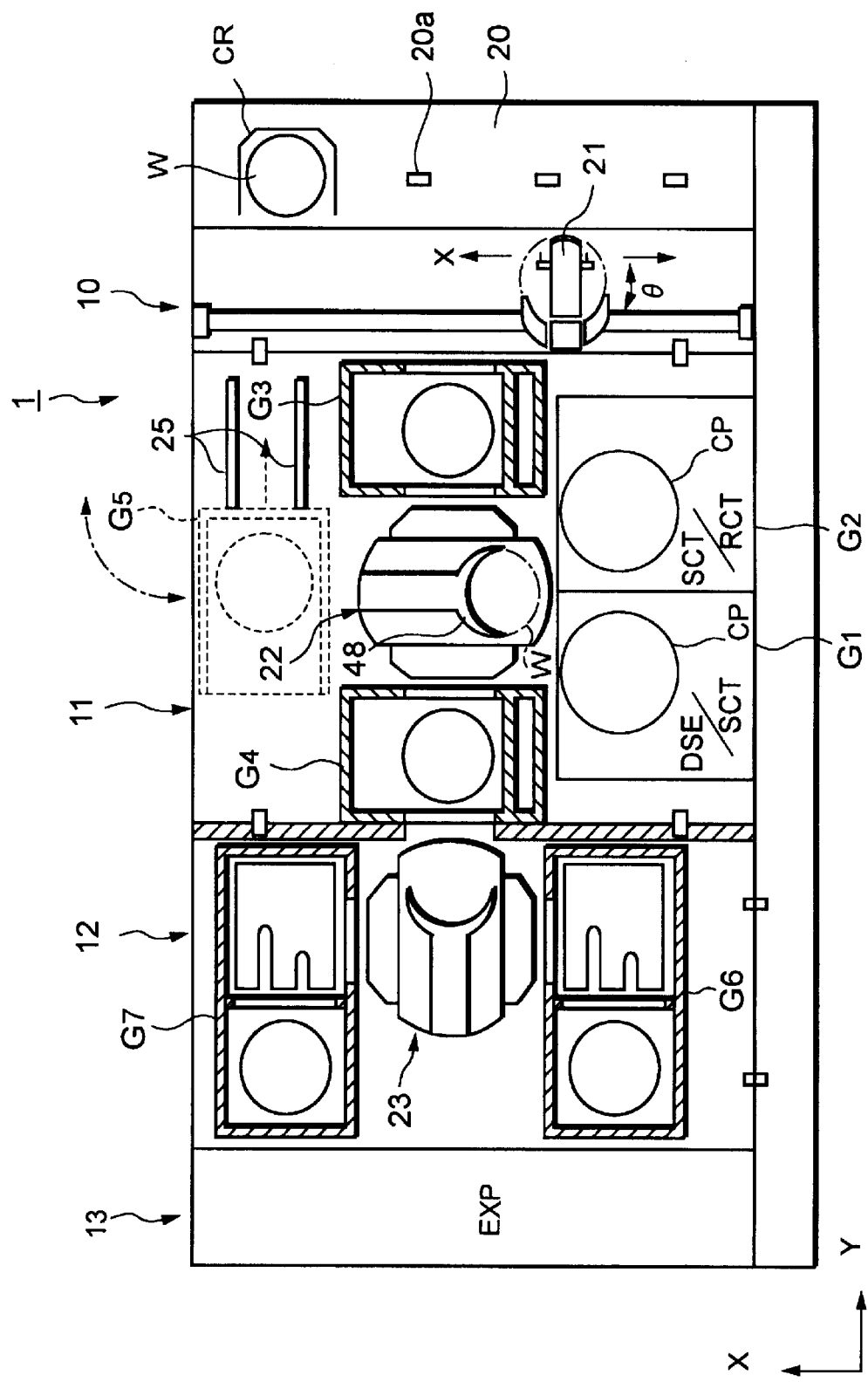
FIG. 1 is a plan view showing the whole structure of a SOD system in which a substrate processing apparatus of the present invention is being utilized.
Figure 2:
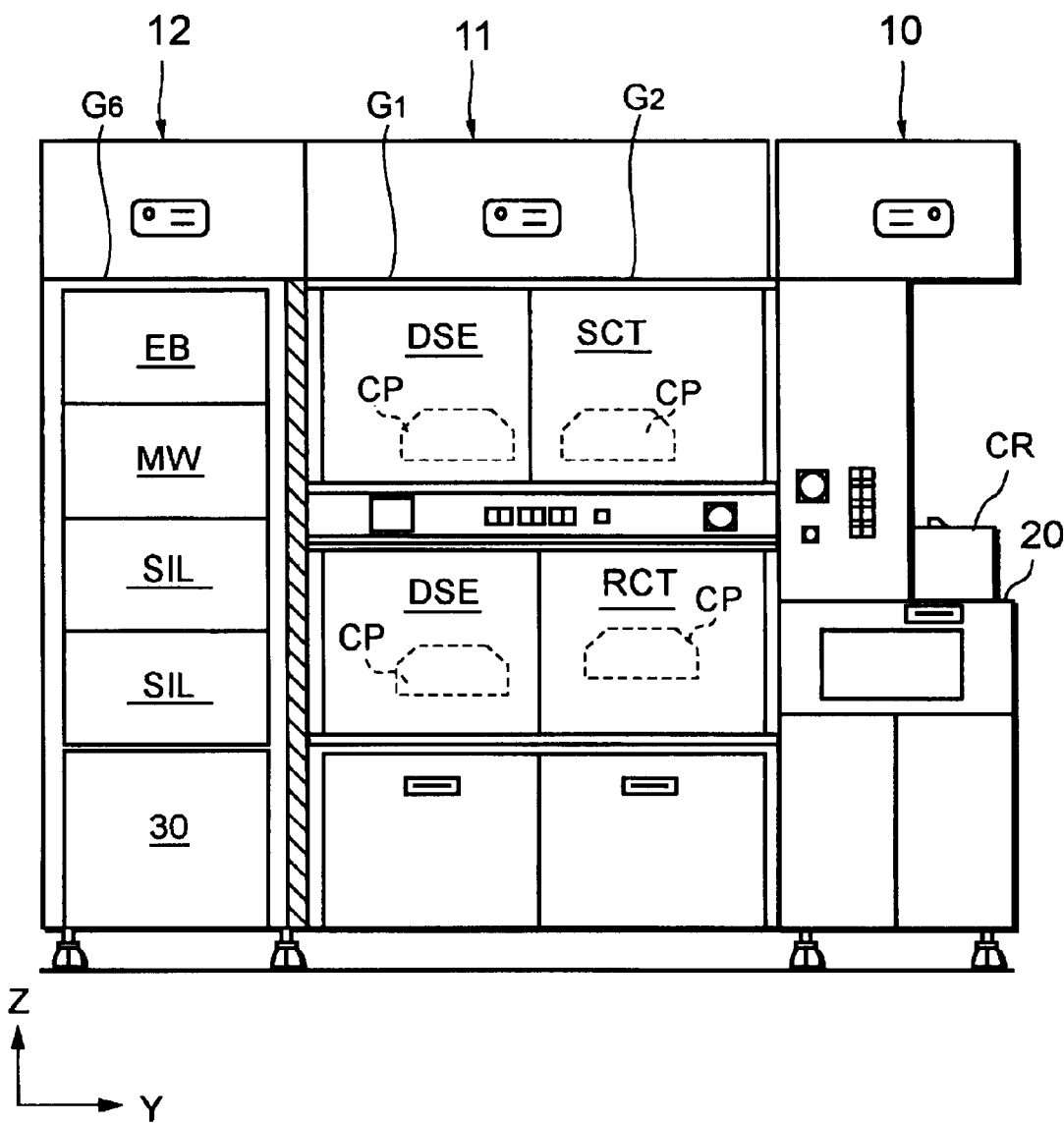
FIG. 2 is a front view of the SOD system illustrated in FIG. 1.
Figure 3:
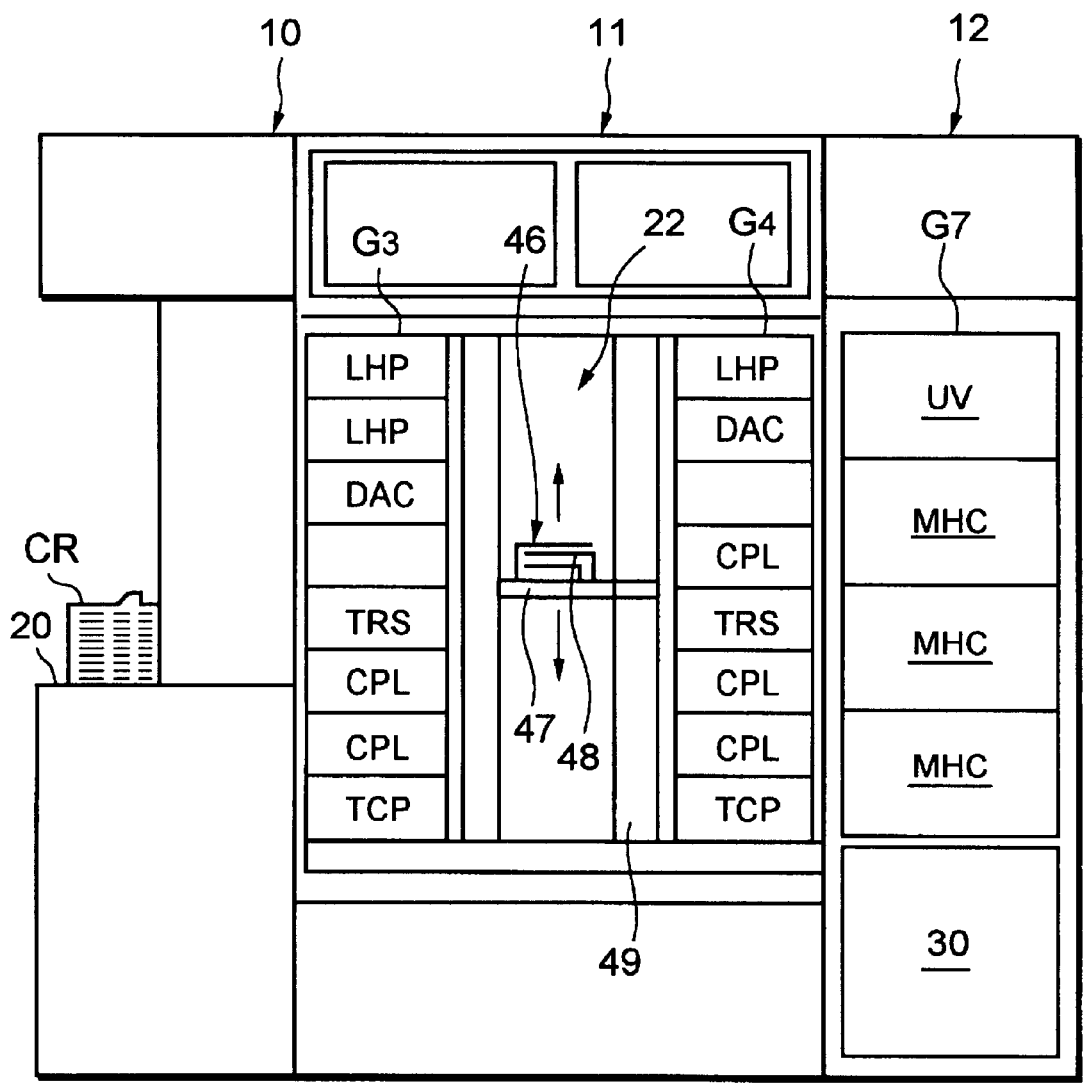
FIG. 3 is a rear view of the SOD system illustrated in FIG. 1.

FIG. 1 to FIG. 3 are drawings showing the entire structure of a SOD system and a silylation processing apparatus according to an embodiment of the present invention. FIG. 1 is a plan view, FIG. 2 is a front view, and FIG. 3 is a rear view.

A SOD and silylation processing system apparatus 1 has a structure that a cassette block 10 provided for transferring a plurality of, for example, 25 wafers W (hereinafter referred to as a wafer) as substrates to be processed per wafer cassette CR, as a unit, from/to the outside into/from the apparatus and carrying the wafer W into/out of the wafer cassette CR, a processing block 11 in which various kinds of processing units each performing a predetermined process for the wafer W one by one in the step of SOD coating process disposed in multi-stages at a predetermined position, and a second processing block 12 similarly various kinds of processing units each performing a predetermined process for the wafer W one by one and performing a heating process at higher temperature than the temperature of a heating-type processing unit in the first processing block disposed in multi-stages at a predetermined position are integrally connected. Moreover, an exposing process unit 13 is disposed adjacent to a second processing block 12.

In the cassette block 10, as illustrated in FIG. 1, a plurality of, for example, up to four wafer cassettes CR are mounted in a line in an X-direction at a position of a projection 20a on a cassette mounting table 20 with respective wafer transfer ports facing the first processing block 11 side. A wafer transfer mechanism 21 movable in the direction of arrangement of cassettes (the Z vertical direction) selectively gets access to each of the wafer cassettes CR. Furthermore, this wafer transfer mechanism 21 is also structured to be able to rotate in a θ-direction so as to get access to a transfer and cooling plate (TCP) included in a fourth multi-staged unit portion in section G4 at the first processing block 11 side that will be described later.

In the first processing block 11, as illustrated in FIG. 1, a first main transfer mechanism 22 of vertical-transfer type is provided in the middle, and all of the processing units are disposed in multi-stages around the first main transfer mechanism 22 in a form of a single group or a plurality of groups. In this group, five groups G1, G2, G3, G4, and G5 are multi-staged in structure and multi-staged units of G1 and G2 in the first and the second group are disposed in the front of the system (front side in FIG. 1) in line, a multi-staged unit of G3 in the third group is disposed adjacent to the cassette block 10, and a multi-staged unit of G4 in the fourth group is disposed adjacent to the second processing block 12.

As illustrated in FIG. 2, in the first group G1, a SOD coating process unit (SCT) coating an insulation film on the wafer evenly with supplying an insulation film forming material on the wafer placed on a spin chuck in a cup CP and having the wafer rotate, and a solvent exchange process unit (DSE) exchanging solvent on the insulation film coated on the wafer with other solvents before proceeding onto drying step by supplying solvent for exchange are disposed vertically in two stages from the bottom in order.

Also, in the second group G2, the SOD coating process unit (SCT) coating an insulation film on the wafer evenly with supplying an insulation film forming material on the wafer placed on a spin chuck in a cup CP and having the wafer rotate, and a resist for silylation coating unit (RCT) coating a resist for silylation on the insulation film with supplying the resist for silylation thereon while placing the wafer W after the insulation film is being formed on the spin chuck in a cup CP are disposed vertically in two stages from the bottom in order.

As illustrated in FIG. 3, in the third group G3, a transfer and cooling plate (TCP), two cooling process units (CPL), a transition unit (TRS), an aging process unit (DAC), and two low temperature heating process units (LHP) are multi-staged in order from the bottom.

In the fourth group G4, the transfer and cooling plate (TCP), three cooling process units (CPL), a transition unit (TRS), an aging process unit (DAC), and a low temperature heating process units (LHP) are disposed in multi-stages.

The transfer and cooling plate (TCP) is structured to be in two stages, having a cooling plate for cooling the wafer W as the lower stage and a transfer table as the upper stage, transferring the wafer W from the cassette block 10 to the first processing block 11 or from the first processing block 11 to the cassette block 10. Similarly, the transition unit (TRS) also transfers the wafer W from the cassette block 10 to the first processing block 11 or vice versa. The aging process unit (DAC) introduces $NH_3+H_2O$ into a processing chamber that can be hermetically sealed, performing an aging process on the wafer W for wet-gelling the insulation film forming material on the wafer W. The cooling process unit (CPL) has the cooling plate for mounting the wafer W, performing the cooling process on the wafer W.

Also, in this SOD system 1, as described above, the multi-staged processing unit group G5 illustrated in broken lines can be disposed in the rear side of the first main transfer mechanism. Incidentally, the multi-staged unit of G5 in the fifth processing unit can be slid along a guiding rail 25 to the side viewing from the first main transfer mechanism 22. When the multi-staged unit of G5 in the fifth processing unit is provided as illustrated in the drawings, the structure thereof is not limited to the sliding shift along the guiding rail 25. The unit may also be structured to be able to rotate and shift to the outside of the system as illustrated with a reciprocating arrow in a dashed line indicating rotation as shown in FIG. 1, so that a space for maintenance work for the first main transfer mechanism can be secured easily.

In the second processing block 12, as described above, a sixth group G6 including a unit performing a heating process on the wafer W with high temperature is disposed at the front of the system. Similarly, a seventh group G7 including a unit performing a heating process on the wafer W with high temperature is disposed at the back of the system. A second main transfer mechanism 23, gets access to the fourth group G4, the sixth group G6, and the seventh group G7 transferring the wafer W, is disposed between the sixth group G6 and the seventh group G7. This second main transfer mechanism 23 has the same structure of vertical transfer type as in the first main transfer mechanism 22.

Incidentally, the SOD system 1 is, for example, disposed inside a clean room and the atmosphere above the first main transfer mechanism 22 is, for example, set to be with higher pressure than a clean room which is set to be the same as the atmospheric pressure, hereby discharging particles generated above the first main transfer mechanism 22 to the outside of the SOD system 1 while preventing entering of the particles in the clean room into the inside of the SOD system 1.

As illustrated in FIG. 2, in the sixth group G6, two stages of silylation processing unit (SIL) as a processing unit according to the present invention, one stage of a microwave processing unit (MW) and one stage of an electron beam processing unit (EB) for heating and reforming a film with radiating microwave and electron beam are provided from the bottom in order. On the other hand, in the seventh group G7, three stages of multi functional hot plate cure apparatus and one stage of ultra violet ray processing unit for heating and reforming a film by radiating ultra violet ray are provided from the bottom in order.

Figure 4:
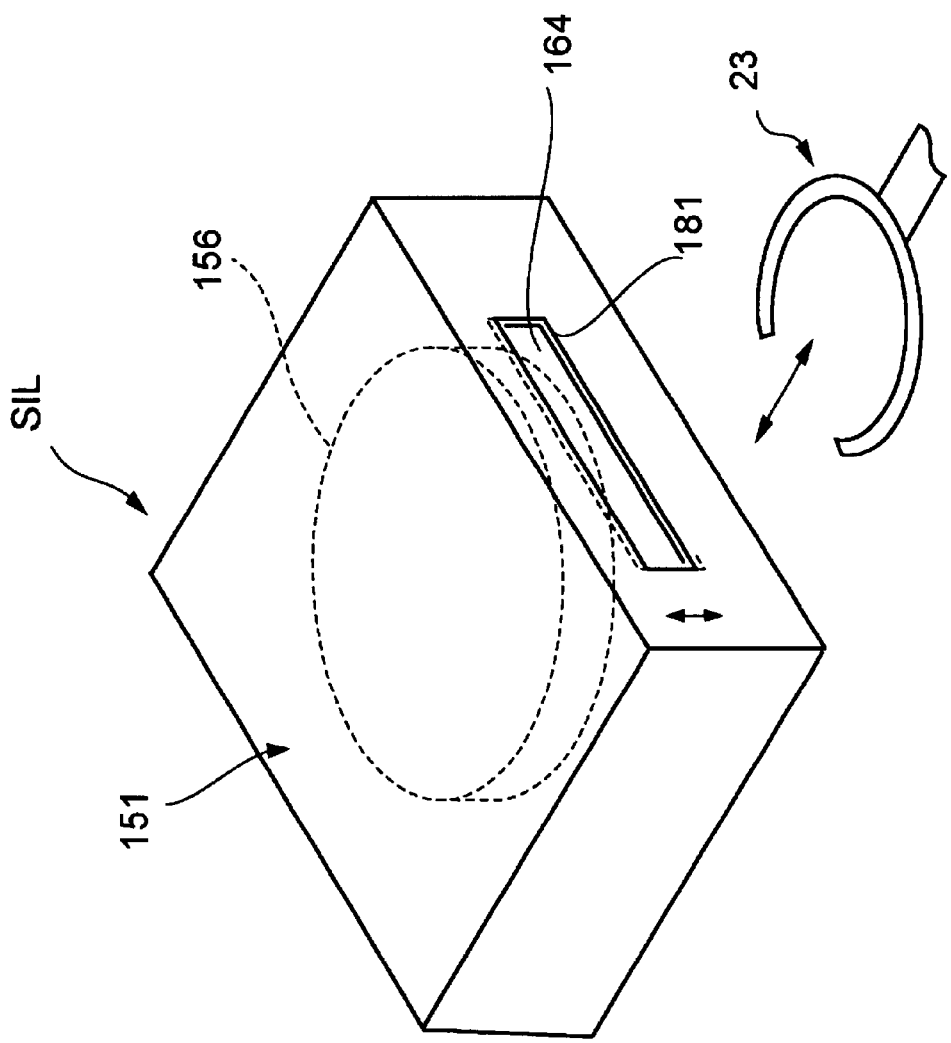
FIG. 4 is a plan view showing a silylation processing apparatus (SIL) according to the present invention.
Figure 5:
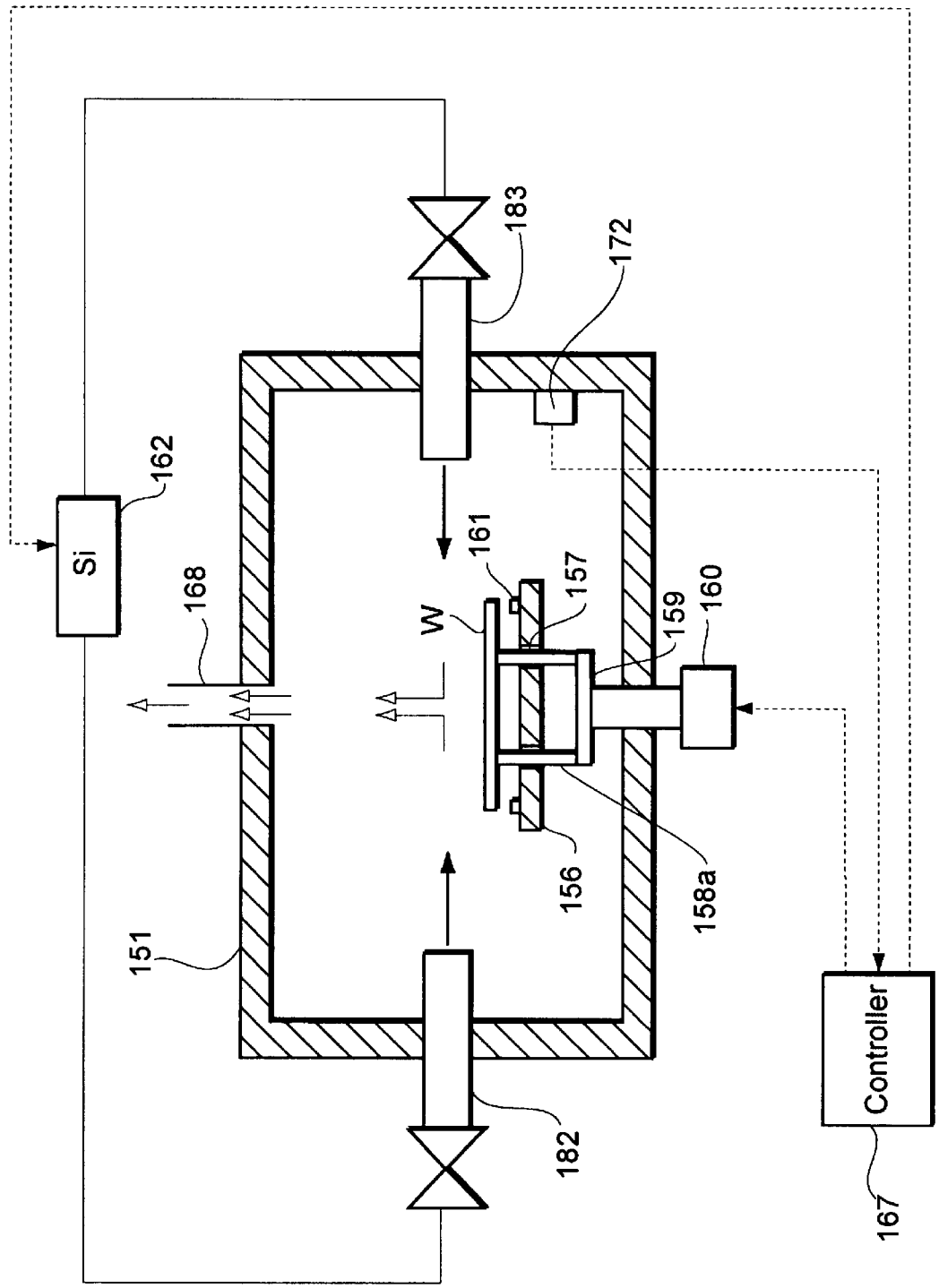
FIG. 5 is a cross sectional view of the silylation processing apparatus (SIL) shown in FIG. 4.

FIG. 4 and FIG. 5 are a perspective view and a sectional view of the silylation processing unit (SIL).

The silylation processing unit (SIL) has a silylation processing chamber 151. The silylation processing chamber 151 is structured to be able to be sealed hermetically.

A heating plate 156 performing a heating process on the wafer W is disposed near the center of the silylation processing chamber 151. A heater (not illustrated), for example, is embedded inside the heating plate 156 and the temperature can be set, for example, in a range of 20° C. to 100° C. In addition, a plurality of, for example three, holes 157 are penetrating through the heating plate 156 on a concentric circle, and a plurality of holding pins 156a for holding the wafer W are inserted to the holes 157 in a manner of being able to raise and lower. These support pins 158a are integrally connected to a connecting portion 159, and being raised and lowered with a lifting cylinder 160 disposed under the connecting portion 159, on the rear side of the heating plate 156. The support pins 158a protrude and sink through the surface of the heating plate 156 with lifting and lowering operation of the lifting cylinder A plurality of proximity pins 161 are also disposed on the surface of the heating plate 156 in order to prevent wafers W from contacting directly with the heating plate 156 when the silylation process is performed. As a result, wafer W is not charged with static electricity at the time of the heating process.

Furthermore, in the silylation processing chamber 151, a gas supplying mechanism 162, supplying a gas to be used as an agent for silylation, for example, dimethylamino silane to the heating process chamber is provided. The gas to be used for silylation is supplied from a gas supply ports 182 and 183 formed on the left and the right side into the chamber according to a signal from a controller 167.

In addition, in the silylation processing chamber 151, a temperature sensor 172 measuring temperature of inside the chamber is attached. The measurement results of the temperature sensor 172 is transmitted to the controller 167, and the controller 167 controls a heating temperature of the heating plate 156 based on the results of the measurement.

A window portion 181 carrying in and out the wafers W with the second main transfer mechanism 23 is provided on a side of the silylation processing chamber 151, and the window portion 181 is structured to be able to be opened and closed with a shutter 181.

The second main transfer mechanism 23 is able to move into the silylation processing chamber 151, and receive the wafer W after being processed with the heating plate 156 in the silylation processing chamber 151 via the support pins 158a.

Incidentally, a gas cylinder or the like of the above-described gas supplying mechanism 162 supplying gas to be used in the silylation processing is placed in a chemical chamber 30 disposed under the multi-functional hot plate cure apparatus (MHC) as shown in FIG. 3.

Next, the steps in the silylation processing performed in the SOD system 1 structured as above will be explained with reference to FIG. 6 and FIG. 7.

Figure 6A:
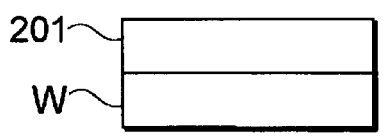
FIG. 6 is a schematic view showing silylation processing steps and wiring steps of the present invention.
Figure 6B:
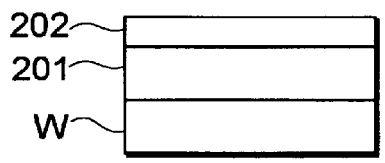
Figure 6C:
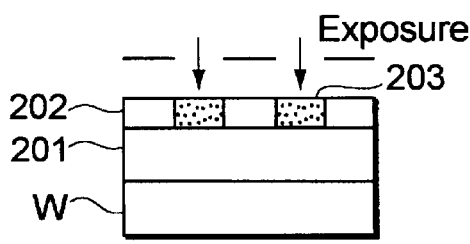
Figure 6D:
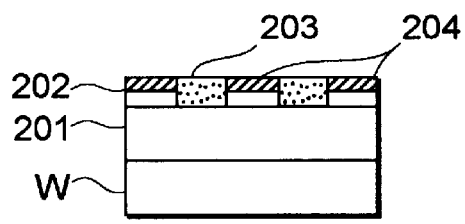
Figure 6E:
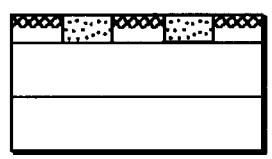
Figure 6F:
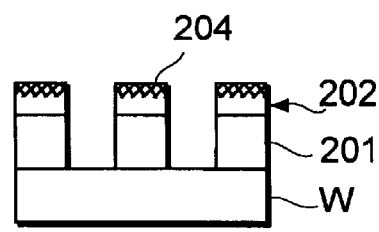
Figure 6G:
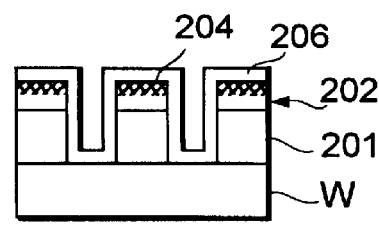
Figure 6H:
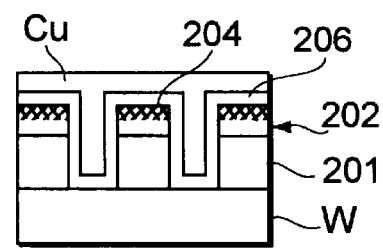
Figure 6I:
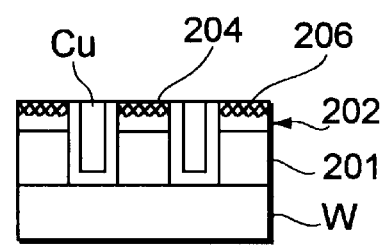
Figure 7:
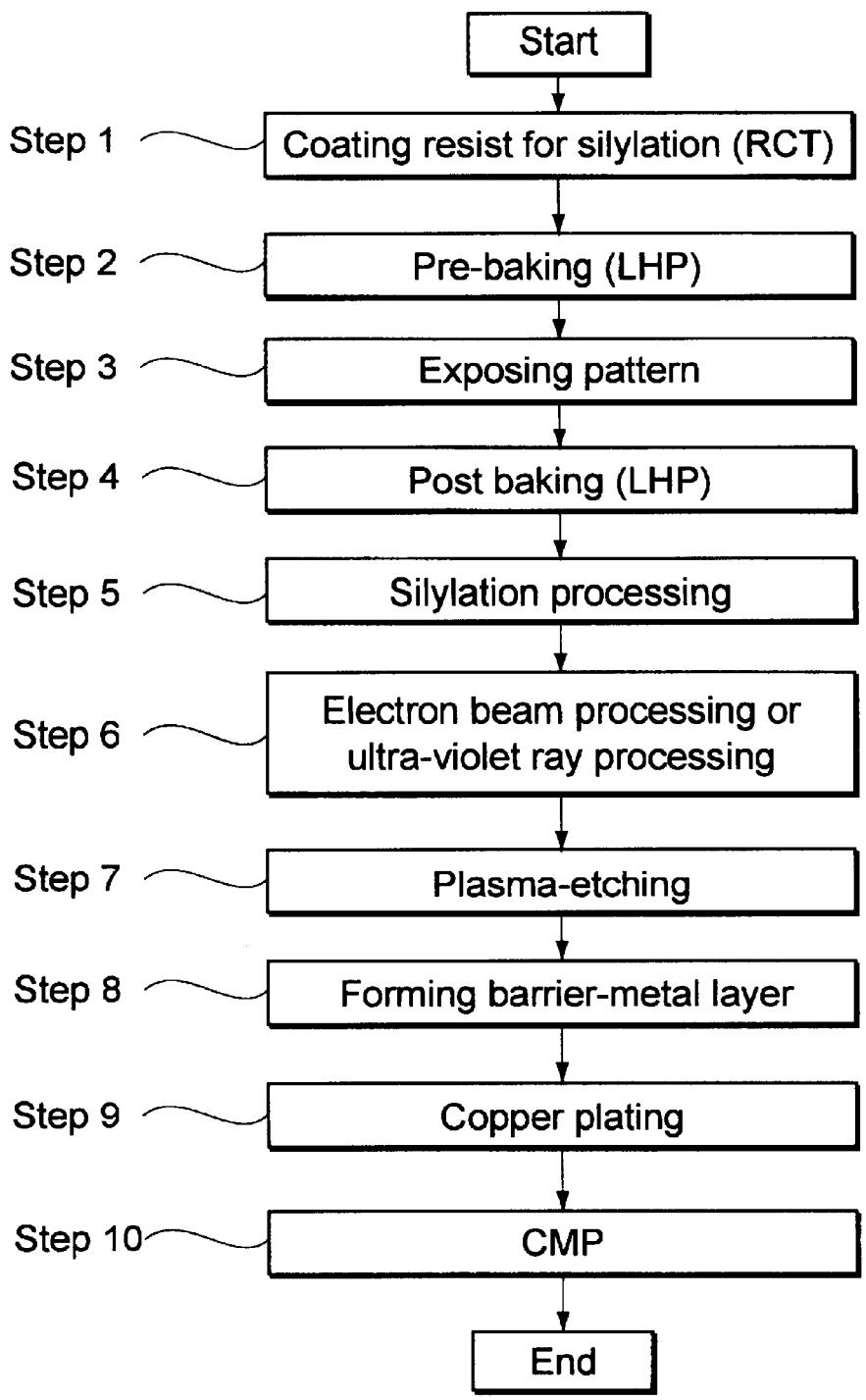
FIG. 7 is a flow chart explaining processing steps as shown in FIG. 6.

FIG. 6 is a schematic view showing steps of the present invention, and FIG. 7 is a flow chart of the process.

The silylation process performed in the SOD system 1 has six steps as illustrated in FIG. 6.

Firstly, as shown in FIG. 6A, an insulation film 201 is formed on the wafer W in the SOD system 1. Then the wafer W is transferred to the resist for silylation coating unit (RCT) included in the second group G2 on the processing block 11 side with the wafer transfer mechanism 22 for coating the resist for silylation 202 on the wafer W. As shown in FIG. 6B, the resist for silylation 202 is coated on the wafer W in the resist for silylation coating unit (RCT) (Step 1). The wafer W coated with the resist for silylation 202 in the resist for silylation coating unit (RCT) is transferred to a low temperature heat processing unit (LHP) with the wafer transfer mechanism 22, and a pre-baking process is being performed thereon. (Step 2).

After the pre-baking process is being performed thereon, as shown in FIG. 6C, the wafer W is transferred to the aligner in the processing block 13 with the first main transfer mechanism 22 and the second main transfer mechanism 23, and a pattern exposure of a desired part is being performed (Step 3). Then, the wafer W is transferred to the low temperature heating process unit (LHP) in the fourth group G4 of the processing block 11 with the second main transfer mechanism 23, and a post-baking process is being performed thereon (Step 4).

After the post-baking process is being performed thereon, the wafer W is transferred to the silylation processing unit (SIL) in the sixth group GG of the processing block 12 with the second main transfer mechanism 23. Specifically, as illustrated in FIG. 4, the second main transfer mechanism 23 transfers the wafer W into the silylation processing chamber 151 proceeding into the chamber through the window portion 181, and the wafer W is transferred onto the support pins 158a at a state of being protruded through the surface of the heating plate 156. After the wafer W is being transferred to the heating plate 156, the second main transfer mechanism 23 retreats to its original position and a hermetic zone is formed inside the silylation processing chamber 151 as the shutter 164 is being closed. While the gas to be used for silylation is supplied to the silylation processing chamber 151 with the silylated gas supply mechanism 162, the heating process (in the range from 20° C. to 100° C.) with the heating plate 156 is started. Also, as shown in FIG. 6D, in the atmosphere of gas to be used for silylation of a predetermined concentration, Si atoms is taken to a non-bridge portion 204, where the silylation process takes place (Step 5). With this process, a silylated layer is formed.

After that, for example, when the heating process of heating the wafer W at 80° C. for 60 seconds is completed, the support pins 158a moves up and protrudes from the surface of the heating plate 156, and the shutter 164 opens. Then the wafer W is transferred to the second main transfer mechanism 23 and taken out from the silylation processing chamber 151.

Next, the wafer W is transferred to the cooling plate on the transfer and cooling plate (TCP). The wafer W then undergoes a cooling process with the cooling plate on the transfer and cooling plate (TCP).

As shown in FIG. 6E, the silylated layer is hardened with the electron beam processing in the electron beam processing unit (EB) included in the sixth group G6 or the ultraviolet ray processing in the ultraviolet ray processing unit (UV) included in the seventh group G7 through the second main transfer mechanism 23 (Step 6).

The process performed in the SOD system 1 is completed with the process described as above, and the wafer W is continuously transferred to an etching process unit (not illustrated) adjacent to the SOD system 1 with the second transfer mechanism 23. Then, as illustrated in FIG. 6F, un-silylated layer is removed as the oxygen plasma etching is being performed. (Step 7).

Next, barrier metal layer 206 is formed on the silylated layer as shown in FIG. 6G (Step 8), and the Cu metal is being coated thereon as shown in FIG. 6H (Step 9).

Furthermore, as illustrated in FIG. 6I, a CMP planarization process is performed using the silylated layer as a CMP stopper (Step 10), and the step of Cu wiring is completed.

As described above, according to this embodiment, the process of forming an insulation film until performing the silylation process on the resist can be persecuted integrally in the SOD system.

(A Second Embodiment)

Figure 8:
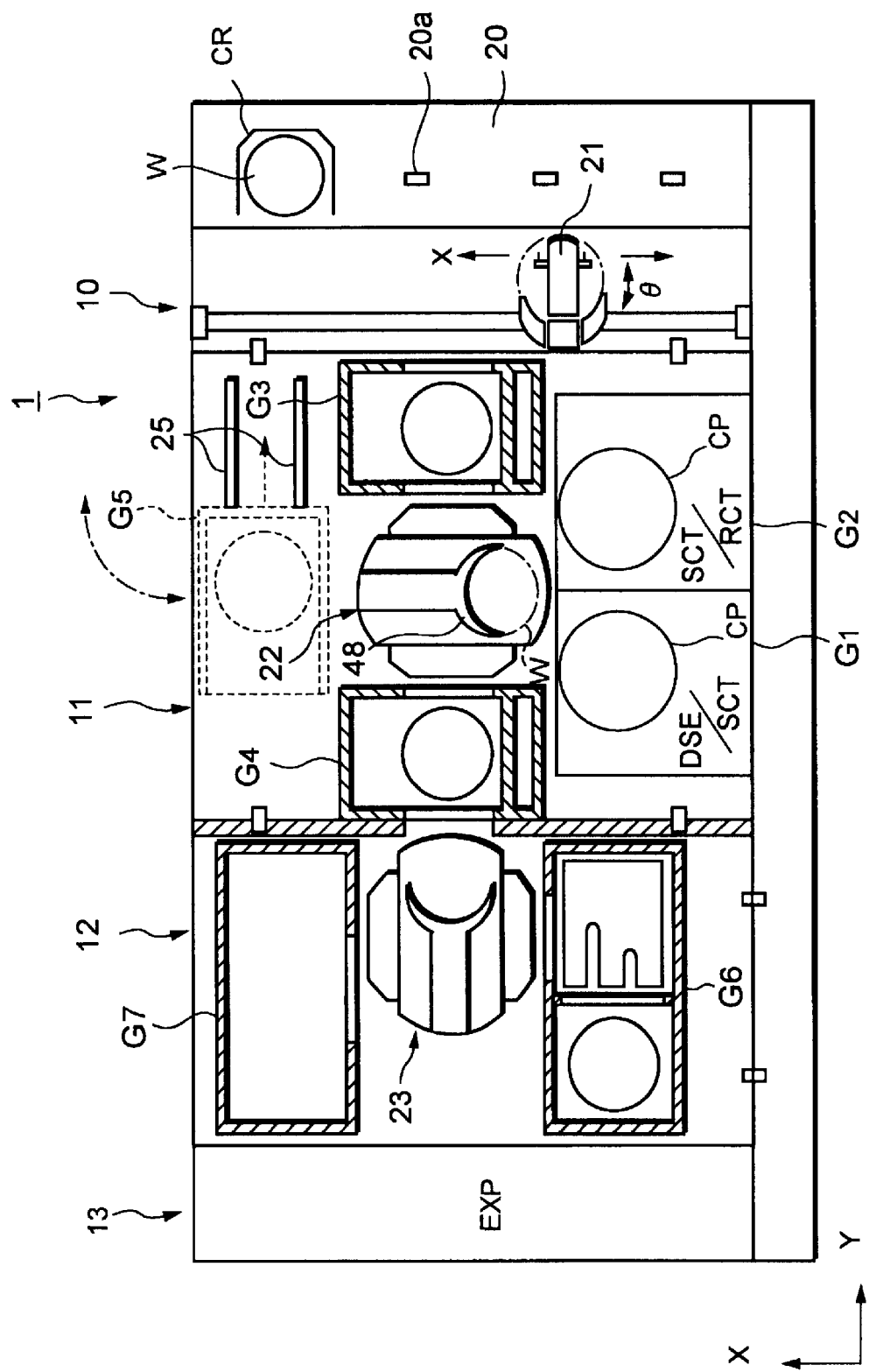
FIG. 8 is a plan view showing the whole structure of a SOD system in which a substrate processing apparatus according to a second embodiment of the present invention is being utilized.
Figure 9:
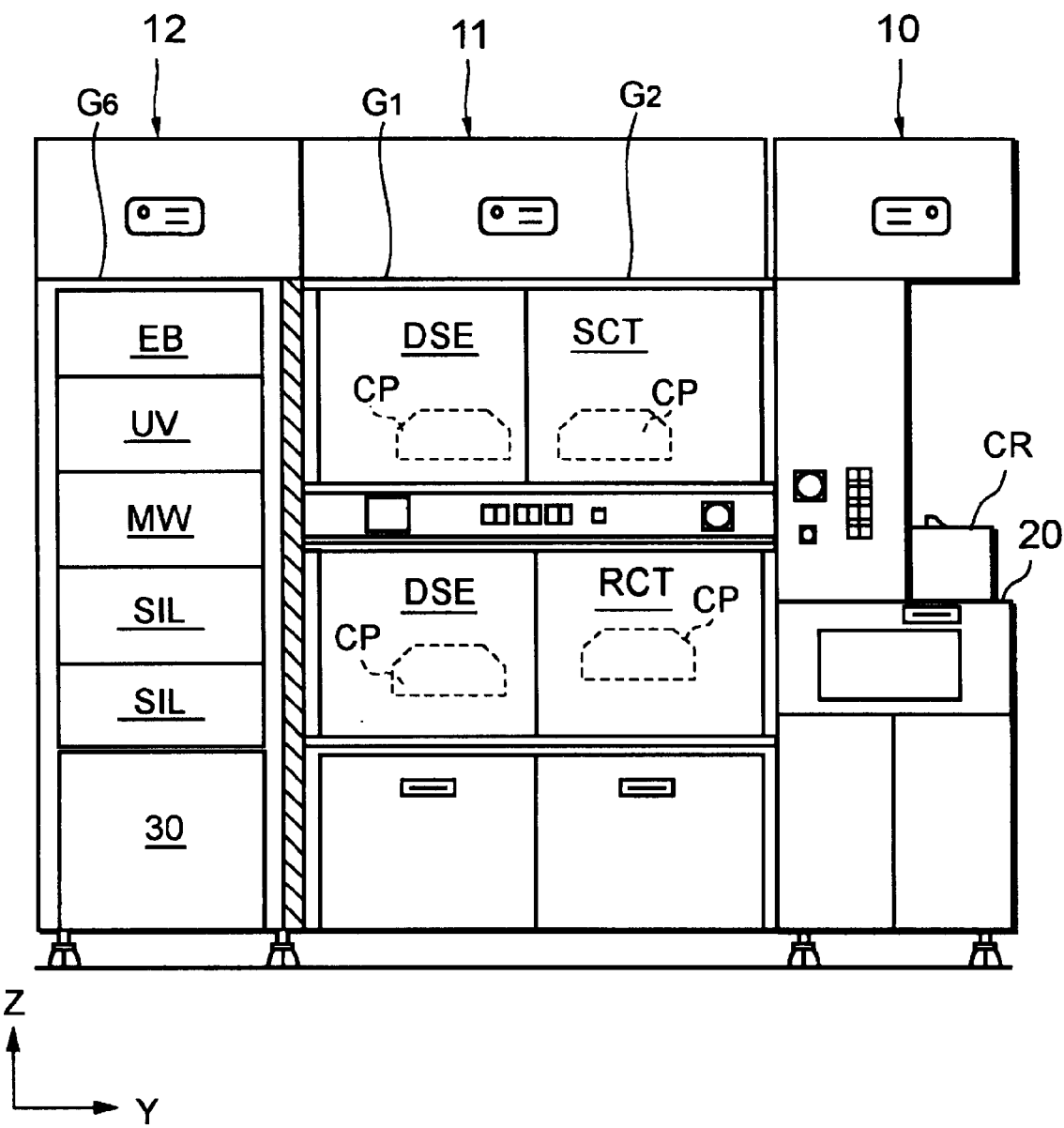
FIG. 9 is a front view of the SOD system as shown in FIG. 8.
Figure 10:
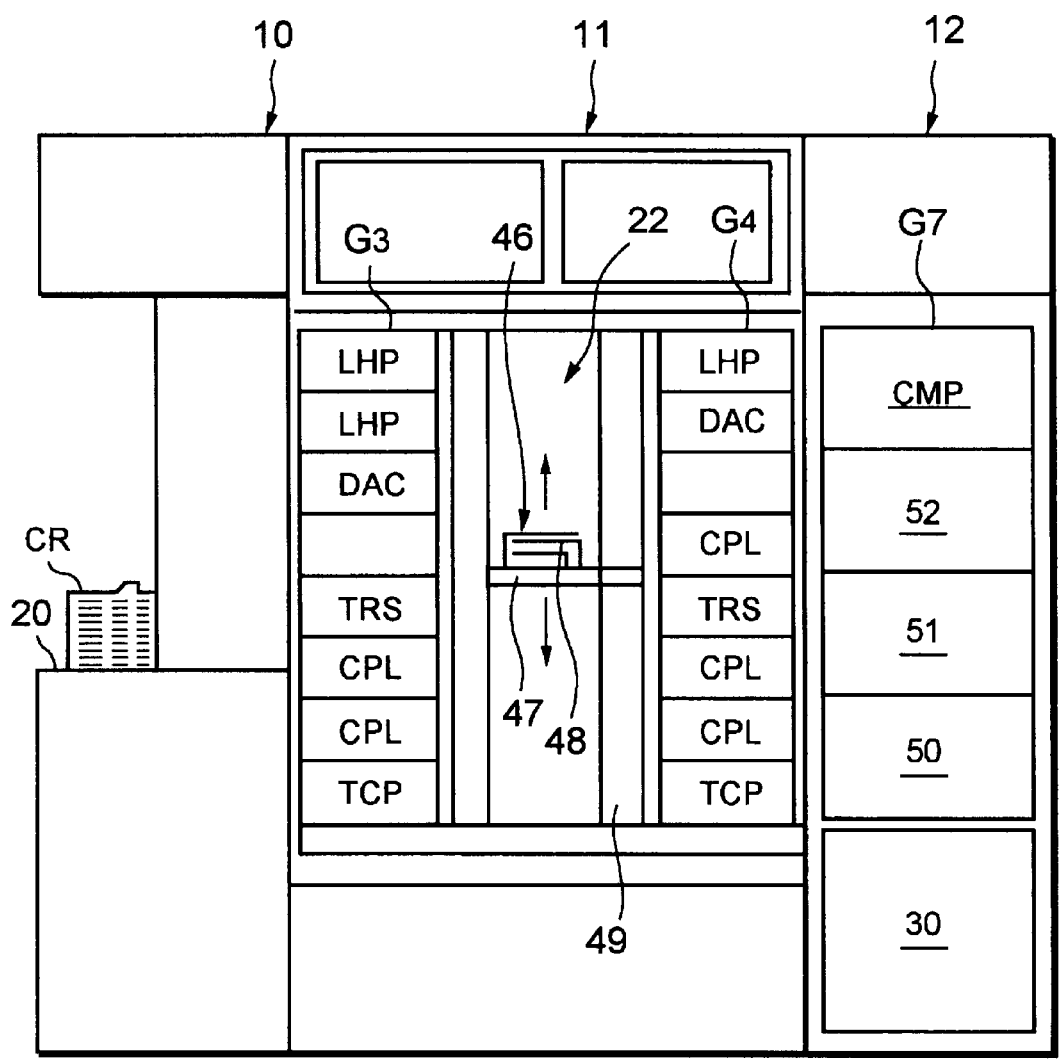
FIG. 10 is a rear view of the SOD system as shown in FIG. 8.
Figure 11A:
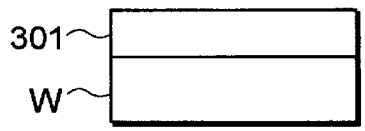
FIG. 11 is a schematic view showing a silylation processing step and a wiring step of a prior art.
Figure 11B:
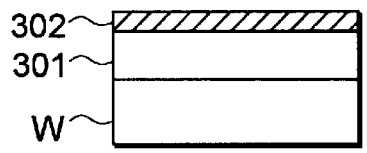
Figure 11C:
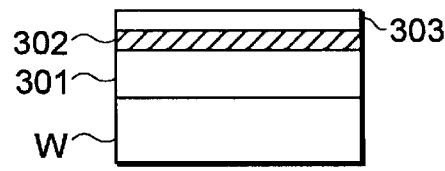
Figure 11D:
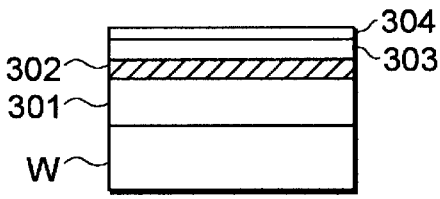
Figure 11E:
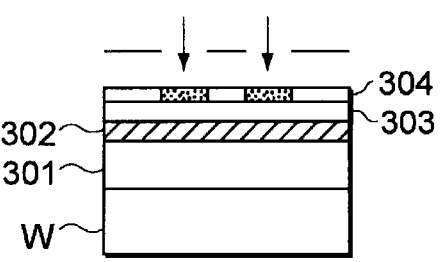
Figure 11F:
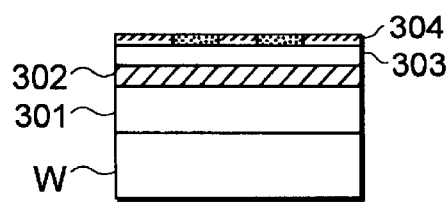
Figure 11G:
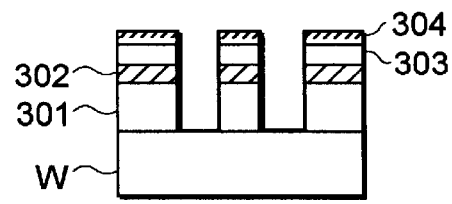
Figure 11H:
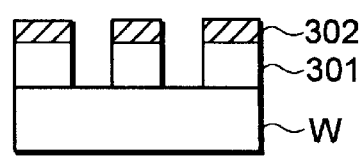
Figure 11I:
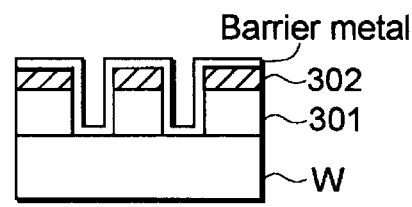
Figure 11J:
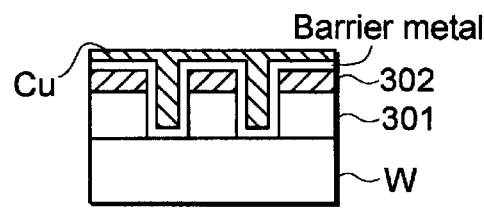
Figure 11K:
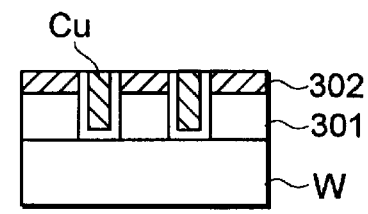
Figure 12:
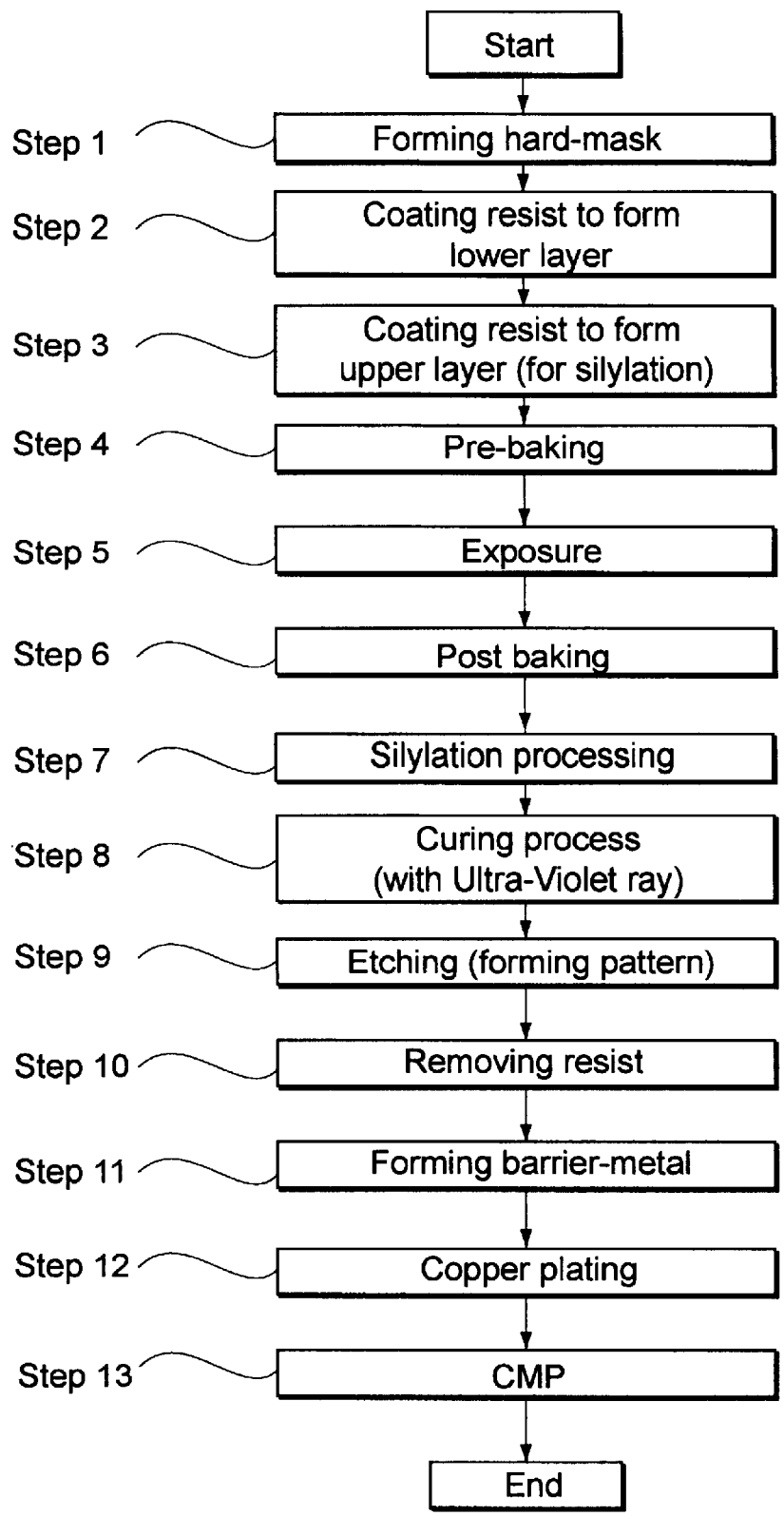
FIG. 12 is a flow chart explaining processing steps as illustrated in FIG. 11.

FIG. 8, FIG. 9, and FIG. 10 are drawings showing the entire structure of a SOD system and silylation process apparatus according to the second embodiment of the present invention. FIG. 8 is a plan view, FIG. 9 is a front view, and FIG. 10 is a rear view respectively. Incidentally, in FIG. 8, FIG. 9, and FIG. 10, the same numerals and symbols will be used to designate the same components as those in FIG. 1, FIG. 2, and FIG. 3, and the explanation thereof will be omitted.

In the sixth group G6, two silylation processing units (SIL), a microwave processing unit (MW) radiating microwave for heating and reforming film with radiating microwave, the ultraviolet ray processing unit (UV), and the electron beam processing unit (EB) are provided one each from the bottom in order. On the other hand, in the seventh group G7, an etching process unit 50, a metal film forming process unit 51, a metal coating process unit 52, and a planarization process unit (CMP) are provided from the bottom in order. The metal film forming process unit 51 is, for example, a metal film forming apparatus of CVD or the like. The metal coating process unit 52 is an apparatus, capable of forming a metal film with spinning.

Next, the silylation processing step to be performed in the SOD system 1 structured as above will be explained with reference to FIG. 6 and FIG. 7 used for an explanation in the first embodiment.

After the insulation film 201 is formed on a wafer W as illustrated in FIG. 6A, the resist for silylation 202 is coated on the wafer W as illustrated in FIG. 6B (Step 1). Then, the wafer W undergoes a pre-baking process (Step 2), and the pattern exposure is being performed on a desired part (Step 3). After the exposure shown in FIG. 6C, the wafer W undergoes the post-baking process (Step 4), followed by the silylation process (Step 5). The wafer W then undergoes the cooling process on the cooling plate in the transfer and cooling plate (TCP).

Next, the wafer W is transferred to the electron beam processing unit (EB) or the ultraviolet ray processing unit (UV) included in the sixth group G6 with the second main transfer mechanism 23. Here, with performing the electron beam processing or the ultraviolet ray processing, the silylated layer is hardened as illustrated in FIG. 6E (Step 6).

Next, the wafer W is transferred to the etching process unit 50 in the seventh group G7 with the second main transfer mechanism 23. Then, as illustrated in FIG. 6F, un-silylated layer is removed as the oxygen plasma etching is being performed (Step 7).

The wafer W is then transferred to the metal film forming process unit 51 of the seventh group G7 with the second main transfer mechanism 23, and the barrier metal layer is formed on the silylated layer with a CVD method or a spinning method as illustrated in FIG. 6G (Step 8). Incidentally, TiN or TaN, for example, can be used as materials for the barrier metal layer. The wafer W is transferred to the metal coating process unit 52 with the second main transfer mechanism 23, and Cu plating is coated on the barrier metal layer as shown in FIG. 6H (Step 9).

After that, the wafer W is transferred to the CMP included in the seventh group G7 with the second main transfer mechanism 23, a planarization processing is performed with using the silylated layer as a CMP stopper as shown in FIG. 6I (Step 10), and the Cu wiring step is completed.

With this structure, patterning the insulation film is possible with a single layer of a silylated resist film since the resist film for silylation is applied directly onto the insulation film and used as a hard mask. Moreover, the silylated resist can also be used as the CMP stopper without removing thereof. Therefore, a resist removing process can be omitted and throughput can be improved.

In the second embodiment, since the etching process unit 50, the metal forming process unit 51, the metal coating process unit 52, and the planarization process unit (CMP) are included in the SOD system 1, a series of damascene steps up to CMP can be performed in this SOD system 1, causing an improvement in manufacturing efficiency.

The steps can be simplified since a hard mask is not required to be formed beforehand as the silylated resist is hardened with the ultraviolet ray processing or the electron beam processing It should be noted that the present invention is not limited to the embodiments explained above.

For example, the etching in Step 7 may be performed immediately after the silylation processing is completed, and the electron beam processing or the ultraviolet ray processing in Step 6 may be performed thereafter.

Furthermore, although the aforesaid embodiments are explained with the examples in which the silicon wafer W is used as a substrate, the present invention can be applied to other substrates such as a glass substrate.

As described above, according to the present invention, the resist film becomes able to be used as the hard mask for patterning the insulation film with silylation. Also, in the wiring step, patterning the insulation film can be simplified since resist film need not to be removed. In addition, a process from forming the insulation film until the silylation process and patterning of the resist can be performed integrally since the unit for silylation is included into the SOD system for forming the insulation film. Furthermore, the steps can be simplified, thereby improving throughput.

The disclosure of Japanese Patent Application No.2001-191954 filed Jun. 25, 2001 including specification, drawings and claims are herein incorporated by reference in its entirety.

Although only some exemplary embodiments of this invention have been described in details as above, those skilled in the art should readily appreciate that many modifications are possible in the exemplary embodiments without materially departing from the novel teachings and advantages of this invention. Accordingly, all such modifications are intended to be included within the scope of this invention.

What is claimed is:

1. A film forming method, comprising the steps of:
   (a) coating a resist film for silylation on a surface of an insulation film of a semiconductor substrate;
   (b) exposing a pattern on the resist film for silylation;
   (c) performing a silylation process with causing the resist film for silylation chemically react with a compound including silicon and forming a silylated layer;
   (d) etching the insulation film using the silylated layer as a mask; and
   (e) forming a metal film on the silylated layer without removing the silylated layer used as the mask.

2. The film forming method as set forth in claim 1, wherein the mask is formed with dry etching the silylated layer in the step (d).

3. The film forming method as set forth in claim 1, wherein a step of hardening the silylated layer with performing at least one of an electron beam processing and an ultraviolet ray processing is provided before the step (d).

4. The film forming method as set forth in claim 2, wherein a step of hardening the silylated layer with performing at least one of electron beam processing and ultraviolet ray processing is provided after the step (d).

5. The film forming method as set forth in claim 2, wherein a step of planarizing the film surface with performing a chemical mechanical polishing using the silylated layer as a stopper is provided after the step (e).

* * * * *